US008166445B1

(12) United States Patent
Chen et al.

(10) Patent No.: US 8,166,445 B1
(45) Date of Patent: Apr. 24, 2012

(54) ESTIMATING ICC CURRENT TEMPERATURE SCALING FACTOR OF AN INTEGRATED CIRCUIT

(75) Inventors: Cinti X. Chen, San Jose, CA (US); Yongjun Zheng, Fremont, CA (US); Joe W. Zhao, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 344 days.

(21) Appl. No.: 12/558,109

(22) Filed: Sep. 11, 2009

(51) Int. Cl.
*G06F 17/50* (2006.01)
(52) U.S. Cl. .................... 716/134; 716/108; 716/113
(58) Field of Classification Search ............... 716/108, 716/113, 134
See application file for complete search history.

(56) References Cited

U.S. PATENT DOCUMENTS

| 5,798,918 A * | 8/1998 | Georgiou et al. ............... 700/28 |
| 5,940,785 A * | 8/1999 | Georgiou et al. ............. 702/132 |
| 6,515,551 B1 * | 2/2003 | Mar et al. ...................... 331/111 |
| 6,753,739 B1 * | 6/2004 | Mar et al. ...................... 331/176 |
| 2008/0288196 A1 * | 11/2008 | Singh et al. ..................... 702/79 |

OTHER PUBLICATIONS

Li, Xiao-Yu et al., "FPGA as Process Monitor—An Effective Method to Characterize Poly Gate CD Variation and Its Impact on Product Performance and Yield", IEEE Transactions on Semiconductor Manufacturing, vol. 17, No. 3, Aug. 2004, pp. 267-272.

* cited by examiner

*Primary Examiner* — Sun Lin
(74) *Attorney, Agent, or Firm* — LeRoy D. Maunu

(57) ABSTRACT

An embodiment of the present invention reduces resources needed to estimate the Icc Current Temperature Scaling Factor (ITSF) of a device, and provides a method and apparatus to estimate ITSF from the device speed and performance characteristics which can be measured at room temperature. In one embodiment, a method for estimating the ITSF of an integrated circuit includes: determining a level of propagation delay of a portion of the integrated circuit; and determining an estimated Icc current temperature scaling factor from a correlation between the level of the propagation delay and a modeled Icc current temperature scaling factor.

20 Claims, 10 Drawing Sheets

ESTIMATING ICC CURRENT TEMPERATURE SCALING FACTOR OF AN INTEGRATED CIRCUIT

FIELD OF THE INVENTION

This invention relates generally to methods and circuits for measuring Icc current of integrated circuits (ICs) at various temperatures.

BACKGROUND

The minimum dimension that a given photolithography process can resolve is alternatively called the minimum feature-size or the critical dimension. The feature-size is a very important parameter, as reductions in the feature-size tend to improve speed performance of the IC. The feature-size of a printed IC device is not uniform. The printing process results in slight variation of the feature-size from lot-to-lot, from wafer-to-wafer, and from device to device within each wafer.

In a circuit, the total electrical current supplied to the collectors of a transistor is referred to as Icc current. As the critical dimensions of transistors are scaled downward, higher density and faster speed requirements result in higher Icc standby currents, especially at higher temperatures. To better predict transistor targets, it is beneficial to know the characteristics of a specific transistor's operation at higher temperature. For Icc standby current, the current method of estimating leakage comprises measuring Icc values at a high temperature, typically 85° C., and at room temperature, 25° C., to create an Icc current temperature scaling factor (ITSF) based on the XY slopes of the fitting curves. From this ITSF, leakages at high temperatures from different wafers and lots with different transistor characteristics can be estimated.

However, this method does not provide an accurate estimation of the ITSF as these fitting curves have different origins on XY plot. Further, measuring Icc current at high temperatures can be time consuming and very costly. Sometimes, the Icc current at a high temperature can be so high that it exceeds the tester measurement limits.

Due to the difficulty of performing Icc measurements at high temperatures and the accuracy limitations of current methods of estimation, it is desirable to accurately estimate Icc currents at various temperatures based on measurements that can be performed at room temperature during wafer sort testing.

SUMMARY

In one embodiment of the present invention, a method is provided for estimating the Icc current temperature scaling factor of an integrated circuit. A model is built to simulate the Icc current at room and high temperatures. The total Icc leakage current is determined by gate current, On current and Off current, all of which are calculated based on transistor characteristics and distribution of the transistors in the circuits. The Icc temperature scaling factor is then calculated as the ratio of the modeled Icc current at room and high temperatures.

The performance of the integrated circuit is then linked to the leakage of the product by correlating the Icc temperature scaling factor to the propagation delay of the circuit. The correlation between levels of modeled propagation delay and modeled Icc current temperature scaling factor is used to estimate the Icc temperature scaling factor, and thus the high temperature Icc leakage of the integrated circuit, at a certain speed and leakage at room temperature.

Another embodiment of a method for estimating an Icc current temperature scaling factor of an integrated circuit includes: determining a level of propagation delay of a portion of the integrated circuit; and determining an estimated Icc current temperature scaling factor from a correlation between the level of the propagation delay and a modeled Icc current temperature scaling factor.

In this embodiment, determining the estimated Icc current temperature scaling factor can include: determining the transistor length/width distribution of transistors used in circuit design; determining transistor on-current, transistor off-current and transistor gate-leakage current of transistors used in the integrated circuit at both room and high temperatures; and determining the estimated Icc current temperature scaling factor from a correlation between the transistor length/width distribution, the transistor-on current level, the transistor-off current level, the gate leakage current level, and the level of propagation delay to the modeled Icc current temperature scaling factor.

In this embodiment, the transistor on-current and transistor off-current can be determined by retrieving transistor on current and transistor off current of transistors from a current look-up table based on the transistor length and width. The determining the propagation delay can includes: configuring the integrated circuit to include at least one ring oscillator that oscillates at a frequency that depends on the propagation delay of the ring oscillator; determining the frequency of a clock signal generated by the ring oscillator; and determining the level of propagation delay from a correlation of the frequency of the generated clock signal to the level of propagation delay.

In this embodiment, determining the propagation delay can include: configuring an integrated circuit simulation to include at least one ring oscillator that oscillates at a frequency that depends on the propagation delay of the ring oscillator; simulating the circuit and determining the frequency of the clock signal generated by the ring oscillator; and determining the level of propagation delay from a correlation of the frequency of the generated clock signal to the level of propagation delay. The integrated circuit can be a programmable logic device. At least one ring oscillator can be designed to simulate the propagation delay of an logic core implemented on the integrated circuit. The length/width distribution of transistors used in circuit design can be determined with length/width extraction tools.

An embodiment of a method of setting device targets of a circuit design includes: configuring a circuit design to include one or more ring oscillators that oscillate at a frequency that depends on the propagation delay of the ring oscillator; configuring simulation settings for a target device; simulating the circuit design; determining the propagation delay of the one or more ring oscillators; determining an Icc current temperature scaling factor from a correlation between the propagation delay to a modeled Icc current temperature scaling factor; and determining whether the resulting Icc current temperature scaling factor falls within a specified range.

This embodiment can further include: in response to the determined Icc current temperature scaling factor falling outside of a predetermined target range, performing the steps of: selecting a new device target; and repeating the configuring of simulation settings, simulating, determining the propagation delay, and determining the Icc current temperature scaling factor, and determining whether the resulting Icc current temperature scaling factor falls within a specified range using the new device target. In addition, this embodiment can further include: in response to the determined Icc current temperature scaling factor falling outside of a predetermined target range, performing analysis to detect possible hot spots causing contention currents on the circuits. Furthermore, the embodiment can include: in response to the determined Icc current temperature scaling factor falling outside of a predetermined target range, performing the steps of: determining whether device characteristics are the possible cause of Icc current temperature scaling factor falling outside of the predetermined range; and in response to determining device characteristics are a possible cause, performing the steps of: adjusting device transistor characteristics; and repeating the steps of: determining the Icc current temperature scaling factor from a correlation between the propagation delay and the product design model to a modeled Icc current temperature scaling factor; and determining whether the resulting Icc current temperature scaling factor falls within a specified range In addition, this embodiment can further include: in response to determining device characteristics are not a possible cause, performing the steps of: selecting a new device target; and repeating configuring simulation settings, simulating, determining propagation delay, determining the Icc current temperature scaling factor, and determining whether the resulting Icc current temperature scaling factor falls within a specified range. This embodiment can further include: in response to the determined Icc current temperature scaling factor falling within a predetermined target range, determining IccMax current specifications at temperatures above room temperature. In addition, this embodiment can include: in response to the determined Icc current temperature scaling factor falling within a predetermined target range, determining an Icc standby current specification at temperatures above room temperature.

In another embodiment of the present invention, a system is provided for estimating Icc current temperature scaling factor of an integrated circuit. The system includes a processor coupled to a memory storage arrangement. The memory is for storing a circuit design. The system further includes an input output unit coupled to the memory storage arrangement and processor. The processor, memory, and input output unit are configured to determine propagation delay of a portion of an integrated circuit, and estimate Icc current temperature scaling factor from a correlation between the level of modeled propagation delay and modeled Icc current temperature scaling factor.

In this embodiment, the memory can be configured with further instructions for causing the processor to: determine the transistor length/width distribution of transistors used in circuit design; and determine transistor on-current, transistor off-current and transistor gate-leakage current of transistors used in the integrated circuit at both room and high temperatures; and determine the estimated Icc current temperature scaling factor from a correlation between the transistor length/width distribution, the transistor-on current level, the transistor-off current level, the gate leakage current level, and the level of propagation delay to the modeled Icc current temperature scaling factor.

In this embodiment, the memory can be configured with further instructions for causing the processor to determine transistor on-current and transistor off-current by retrieving transistor on current and transistor off current of transistors from a transistor look-up table based on the transistor length and width. The system can further include: an integrated circuit coupled to the input/output unit, where the integrated circuit is configured to include at least one ring oscillator that oscillates at a frequency that depends on the propagation delay of the ring oscillator, where the memory is configured with further instructions for causing the processor to determine the level of propagation delay using the frequency of the generated clock signal. The memory can be configured with further instructions for causing the processor to: configure an integrated circuit design to include at least one ring oscillator that oscillates at a frequency that depends on the propagation delay of the ring oscillator; simulate the circuit and determine the frequency of the clock signal generated by the ring oscillator; and determine the level of propagation delay from a correlation of the frequency of the generated clock signal to the level of propagation delay.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

IccMax current is approximately the sum of transistor gate currents (Igate), transistor-on currents (Ion), and transistor-off currents (Ioff). The Icc Current Temperature Scaling Factor (ITSF) is defined as the ratio of IccMax while the device is operating at a hot temperature over IccMax at room temperature. One or more embodiments of the present invention reduce resources needed to estimate the ITSF of a device and allows estimating ITSF from the device speed and performance characteristics which can be measured at room temperature.

Icc standby current is the device leakage current when it is at standby mode. Some embodiments refer to Icc standby current temperature scaling factor rather than IccMax current temperature scaling factor. It is understood that one or more embodiments of the present invention are applicable to the scaling factor of either current, and such terms are used interchangeably herein.

The present invention creates a model for a certain product design based on the transistor length/width (L/W) distributions used in the product design and Igate, Ion, and Ioff current characteristics of different devices at different transistor corners. The resulting model accurately estimates the ITSF of devices of the same product design using device speed and performance characteristics which are measurable at room temperature during wafer sort. Additionally, the model can be used to set device targets and product specifications prior to any physical realization of the circuit by simulating the circuit to determine performance characteristics. Further, IccMax and Icc standby current specifications are important product specifications, which are Icc leakage current at higher temperatures. One or more embodiments of the present invention provide an accurate, fast and low cost method to estimate the Icc temperature scaling factor, and based on the scaling factor IccMax and Icc standby current specifications may be established for IC products. The accuracy of the method embodied by the present invention is easily shown in comparing ITSF results based on the model with ITSF values measured with the traditional method.

Figure 1:
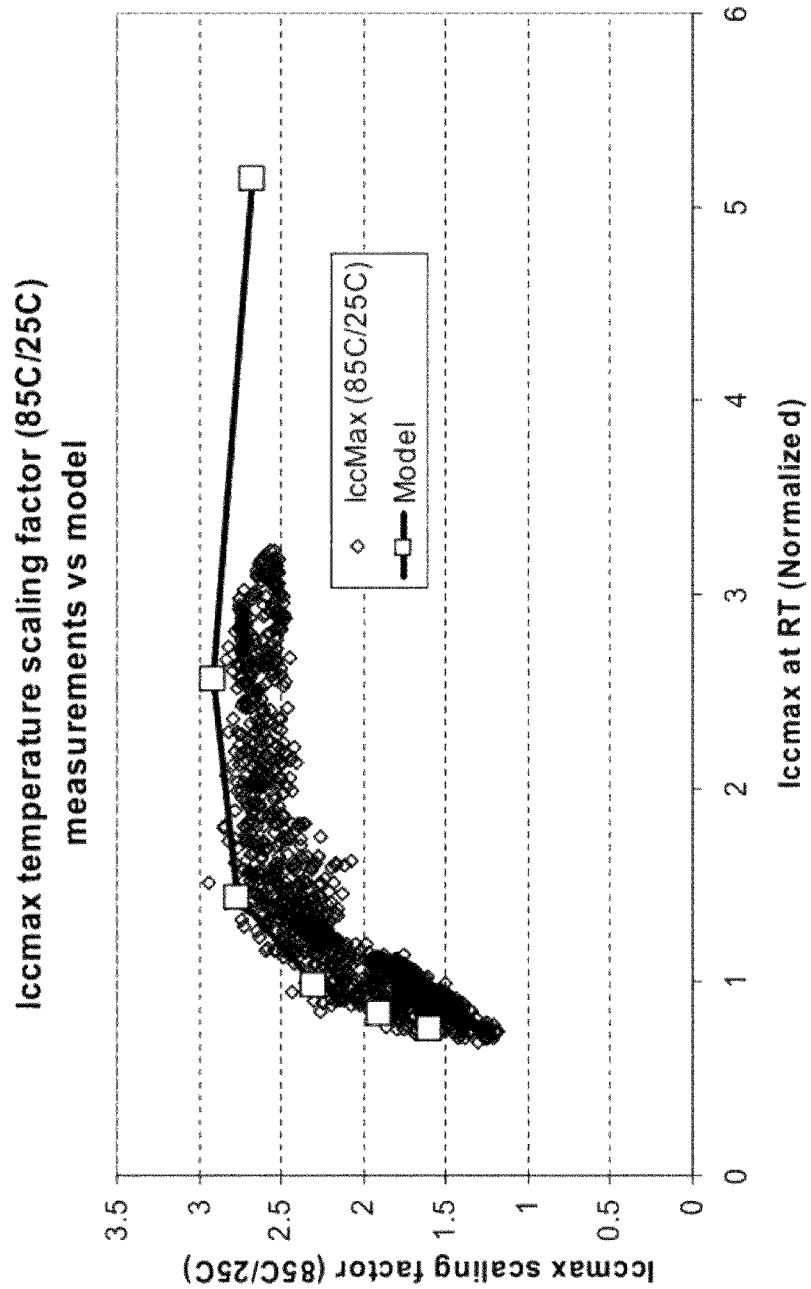
FIG. 1 shows a graph of actual room temperature IccMax current versus predicted and actual IccMax current temperature scaling factor (ITSF)

FIG. 1 illustrates a graph of actual room temperature IccMax current on the normalized X-axis versus predicted and actual IccMax current temperature scaling factor on the Y-axis. The model results provide a tight fitting upper bound of the actual ITSF measurement of several devices even as the ICTS factor becomes saturated for values above 2.50. No fitting parameter is used. The model predicts the scaling factor has a maximum around 3.0.

Figure 2:
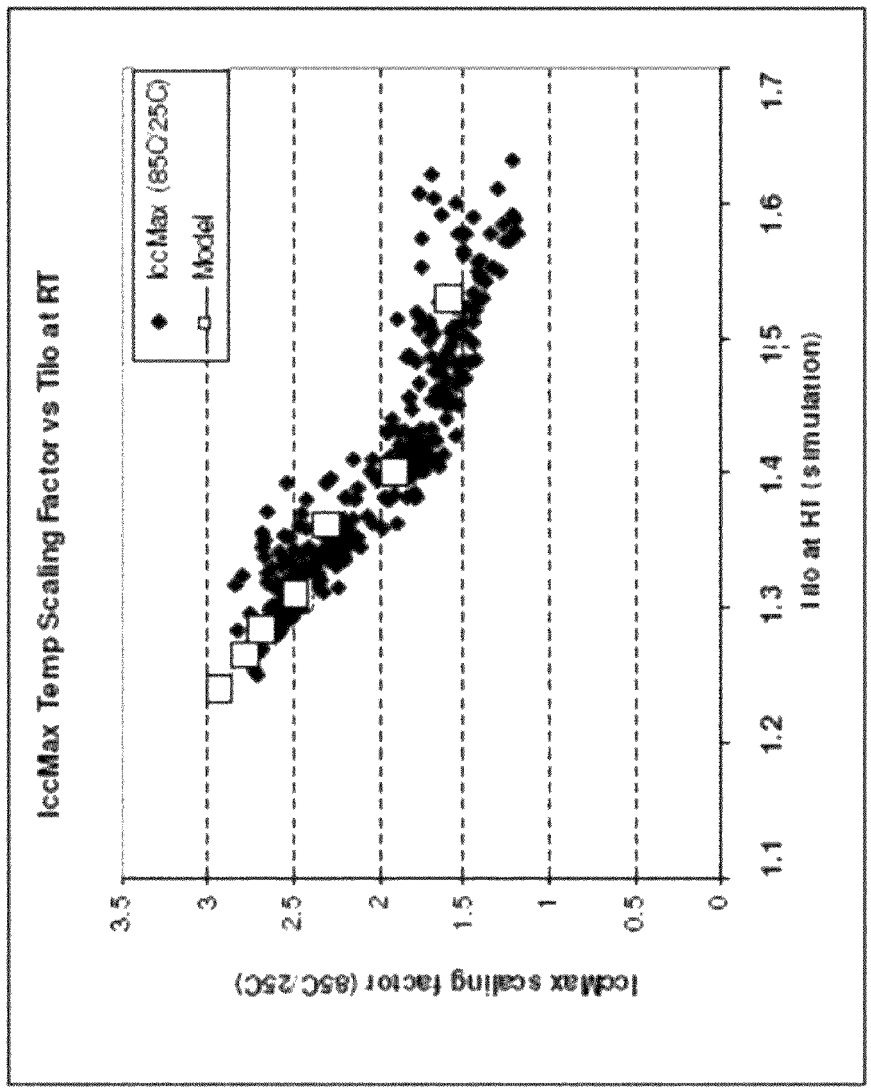
FIG. 2 shows a graph of product speed and performance, as measured using TILO rings at room temperature, versus predicted and actual IccMax current temperature scaling factor.

FIG. 2 illustrates a graph of product speed and performance on the normalized X-axis versus predicted and actual IccMax current temperature scaling factor on the Y-axis. The speed and performance characteristics used as model input were determined by simulating built in self test (GIST) ring oscillators (TILO). The model results tightly fit the linear distribution of the actual results. No fitting parameters were used. These results demonstrate that one or more embodiments of the present invention can accurately estimate ITSF of a device using speed and performance characteristics which are measureable at room temperature.

Figure 3:
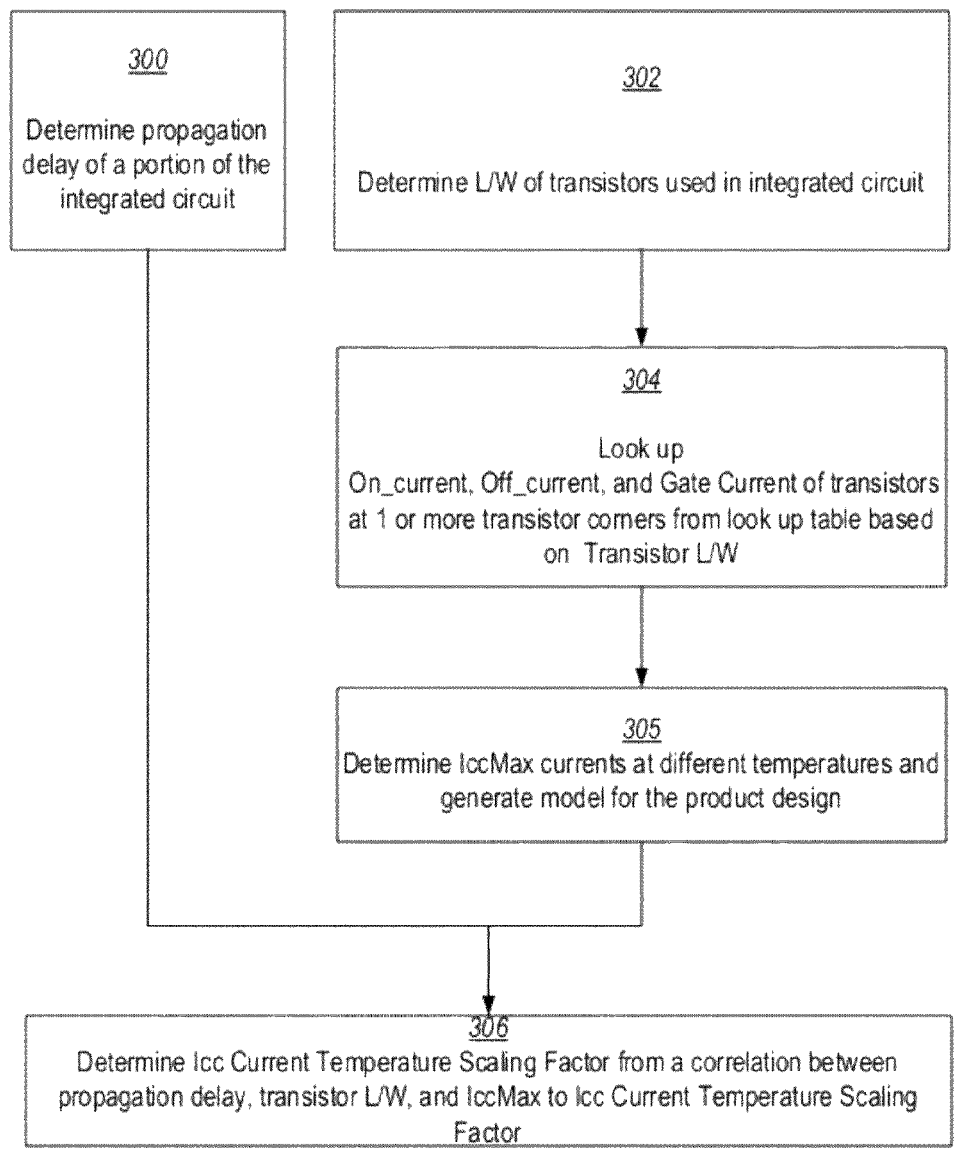
FIG. 3 illustrates a flowchart diagram of a process in accordance with an embodiment of the invention, to estimate the ICTS factor of an integrated circuit.

FIG. 3 illustrates a flowchart of a process in accordance with an embodiment of the invention for estimating the ICTS factor of an integrated circuit. For a certain product design, the process determines the transistor L/W distribution at step 302. The transistor L/W distribution of a product design can be determined using L/W extraction tools.

At step 304, the determined transistor L/W distribution is used to look up, from lookup tables for the product design, transistor gate currents (Igate), transistor-on currents (Ion), and transistor-off currents (Ioff) of different transistors having dimensions that fall within the determined L/W distribution at one or more corners of the transistors. Each look up table is constructed by testing transistors before the final metal mask step and before the device is encapsulated in its final package. This testing process is otherwise known as E-Test. Ion, Ioff, and Igate current contributions to IccMax are calculated by summing currents of the transistors of each look up table that fall within the determined length width distribution at step 305. IccMax is the sum of the transistor Ion, Ioff, and Igate currents. A model of ITSF for the product design, as shown in FIGS. 2 and 3, is created from the calculated IccMax values at room temperature and a hot temperature at step 305.

Propagation delay of the device is determined at step 300. It is understood that other device speed or performance characteristics may be used as well. ITSF is then determined from a correlation between propagation delay, transistor length and width, and IccMax to ITSF at step 306. The ITSF is also stored for subsequent use. This enables accurate estimation of high temperature Icc current by simply sorting wafers at room temperature. The IccMax and Icc standby current specifications are important product specifications, which are Icc leakage current at higher temperatures. One or more embodiments of the present invention provide an accurate, fast, and low cost method to estimate the Icc temperature scaling factor, and based on the scaling factor IccMax and Icc standby current specifications may be stated for IC products.

Device speed and performance characteristics can be determined from built in self test (BIST) ring oscillators. A conventional ring oscillator contains many inverters and a series of buffers. Buffers may be any number of parts or gates, such as AND or NOR gates, such that a signal from the oscillator is fed back into the oscillator input and inverted such that a counter or other detecting means can detect each cycle. When power is applied to the circuit the output of the inverter provides a clock signal. The ring oscillation frequency of the clock signal depends on the delay of the buffers and the routing in between which depends on the L/W distribution of the transistor gates and resulting delay. The time period in which the oscillator is engaged is divided by the number of oscillations to determine the oscillation period. From this, a propagation delay can be determined. Generally, the propagation delay corresponds to the oscillation period divided by the number of buffers used in the ring oscillator.

Figure 4:
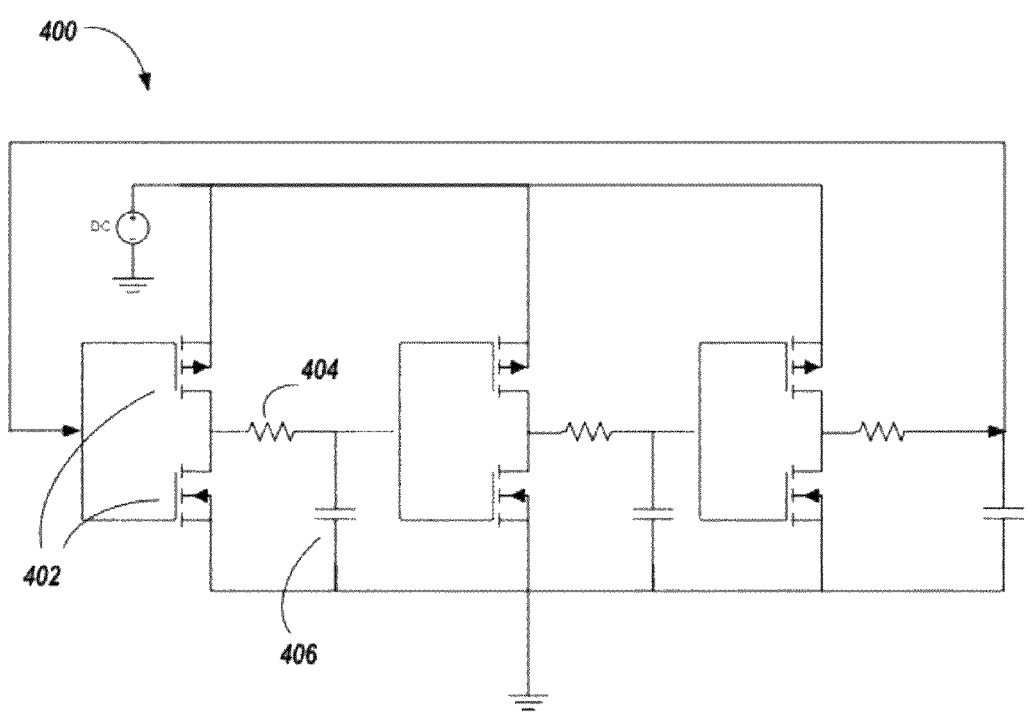
FIG. 4 illustrates a 3 state ITSF oscillator as an example implementation of a built in self test oscillator that may be used in accordance with an embodiment of the invention.

FIG. 4 illustrates a three buffer oscillator as an example CMOS implementation of a built in self test oscillator that may be used in accordance with an embodiment of the invention. Each buffer consists of an inverter gate comprising two CMOS components 402, a resistor 404, and a capacitor 406 coupled to the output of each inverter. The output of each buffer is fed into the next and the output of the last buffer is fed back into the input of the first.

The inverter gates alternately can be replaced by any number of other logic gates such that the signal is inverted before it is fed back as input into the first buffer. To increase accuracy, the gates comprising the buffers can be chosen to represent different paths of the device. For example, if testing a FPGA, one may select logic gates for the buffers to represent each of the logic gates that make up the CLB.

When the circuit is engaged, the output produces a clock cycle whose frequency corresponds to the propagation delay of the buffers. The number of buffers used and the type of gates can be changed to balance a number of factors including accuracy of the test, desired speed of the test, and space requirements on the chip or FPGA.

Figure 5:
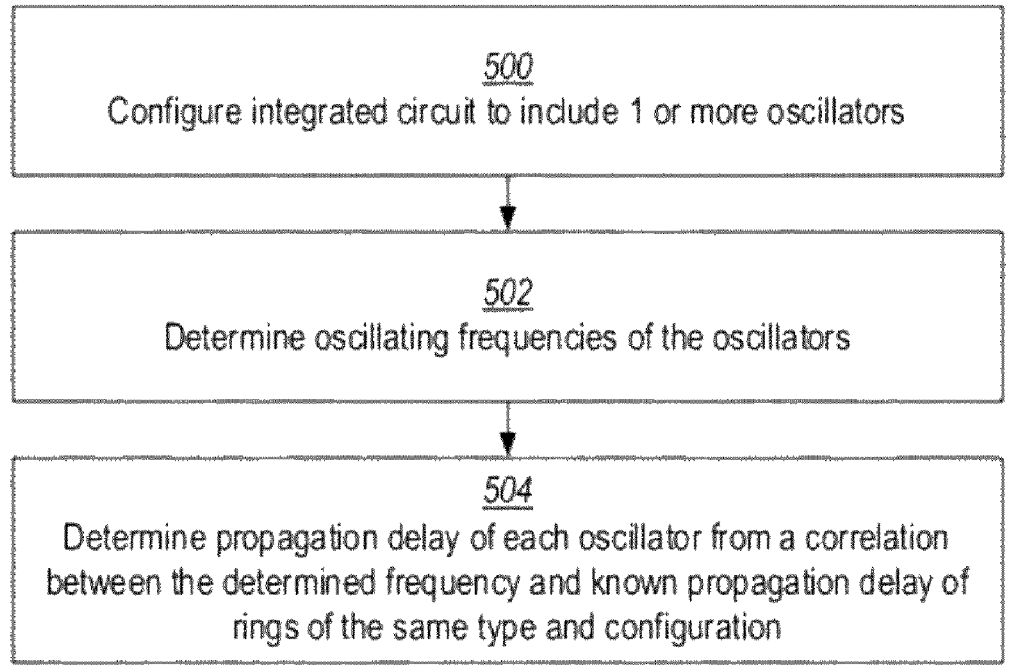
FIG. 5 illustrates a flowchart diagram of one method of determining product speed and performance.

FIG. 5 illustrates, as an example implementation in accordance with an embodiment of the invention, a flowchart of a method of determining device speed and performance using the ring oscillators. An integrated circuit is configured to include one or more ring oscillators at step 500, and each ring oscillator is associated with a respective counter (not shown). At step 502, the ring oscillators are then engaged for a period of time in which oscillations are counted by the counter to determine the oscillating frequencies. Each cycle of an oscillator causes the associated counter to increment by one. The propagation delay of each oscillator is then determined at step 504 from a correlation between the determined frequency and known propagation delay of rings of the same type and configuration.

Figure 6:
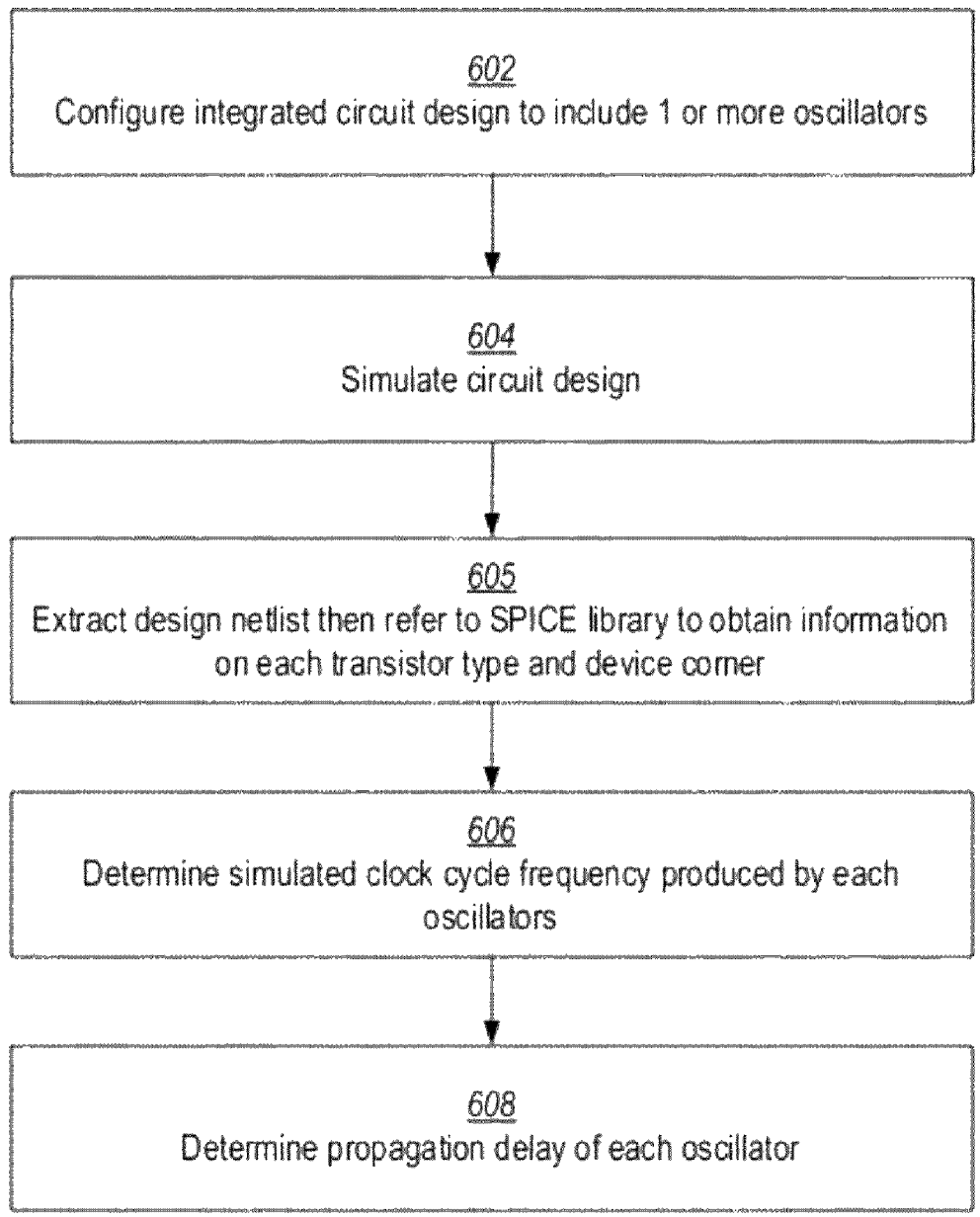
FIG. 6 illustrates a flowchart diagram of a method of determining product speed and performance through simulation.

In one or more embodiments of the invention, rather than printing the device with oscillators and measuring the frequency of the oscillators, the integrated circuit can be modeled in a hardware descriptive language (HDL) and simulated to achieve accurate results. FIG. 6 illustrates, as an example implementation in accordance with an embodiment of the invention, a flowchart of a method of determining propagation delay through simulation of a circuit design. An integrated circuit design is configured to include one or more ring oscillators at step 602, and each ring oscillator is associated with a respective counter (not shown). At step 604, the ring oscillator is simulated for a period of time in which oscillations are counted by the counter to determine the oscillating frequency at step 606. Since oscillators involved different types of transistors throughout whole circuit design, simulation tools can be used to extract design netlist then refer to SPICE library to obtain information on each transistor type and device corner at step 605. Propagation delay is then determined from a correlation between the determined frequency and known propagation delay of rings of the same type and configuration at step 608.

In determining speed and performance using ring oscillators, various types of ring of oscillators may be used including but not limited to: Tilo, single long lines, double long lines, or quad long lines, global clocks, etc. These speed tests involved circuits throughout the whole product design, while proxy rings can represent oscillator behavior within a specific circuit functional block or IP core.

Use of simulation to determine speed and performance characteristics and estimate ITSF is useful because an estimated ITSF can be used to estimate Icc currents using speed/performance for new products and help determine device targets before the circuit design is realized in hardware. As circuit lithography printing technology and capabilities may independently improve and reduce transistor size restrictions during the design process, it is helpful to be able to estimate the effect such improvement would have on Icc currents at various temperatures so the design can be targeted to specific operating characteristics and give accurate guidance in setting up new product specifications.

Figure 7:
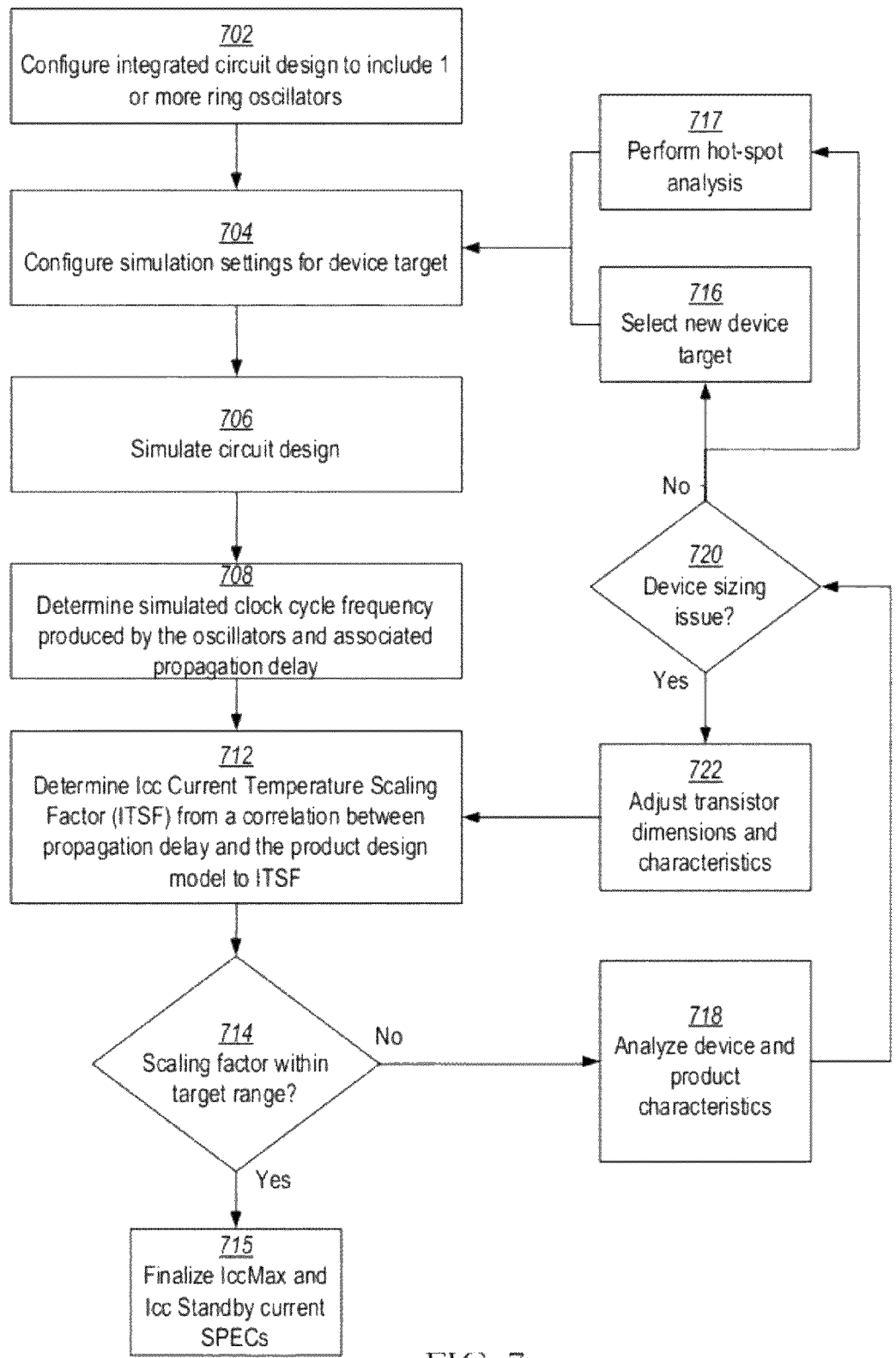
FIG. 7 illustrates a flowchart diagram of a process, to determine device targets of a high level model circuit design using estimated ITSF factor.

FIG. 7 illustrates a flowchart of a process, in accordance with an embodiment of the invention, to determine device targets of a high level model circuit design by determining propagation delay during simulation of the circuit design. The circuit design is configured to include one or more oscillator circuits at step 702. Simulation is configured for different device targets by selecting different part simulation models in the simulator's library at step 704. For example, in the HSPICE simulator, different settings in the SPICE library are selected for the simulation, such as FFF3F, TTTTTT, SSS2S, etc. The device is simulated at step 706 and clock cycle frequencies produced by the oscillators and the associated propagation delays are determined at step 708. ITSF is determined from a correlation between propagation delay and the product design model generated in FIG. 3 to ITSF at step 712. The ITSF factor is also stored for subsequent use. If the scaling factor is not within the desired range as determined at decision step 714, device and product characteristics are analyzed at step 718. In the case of a very high Icc temperature scaling factor, the process checks whether or not the device characteristics are normal. Device characteristics include transistor roll off curves, universal curves, L effect, W effect, N/P ratio and P2P effect, etc. The process also determines which of the components are the dominating components of the Icc current. For example, when the biggest components of Icc leakage current came from NMOS with minimum length and wide width, the very high Icc temperature scaling factor can indicate a possible issue with this type of transistors. It may be because there are simply too many transistors with high temperature scaling factor in the circuits or N/P ratio is too high. The Icc leakage current can be reduced significantly by properly fine tuning these types of transistors, for example, length and width adjustments and implantation process recipe modifications, to reduce transistor off current which dominates at high temperature. If a sizing issue is present, transistor dimensions and characteristic are adjusted at step 722.

If no sizing issue is present (decision step 720), new device targets can be selected at step 716. Additionally, if no sizing issue is present, hot spot analysis can be performed in order to detect possible hot spots causing contention currents on the circuits at step 717. The process is then repeated until scaling factor is desirable. When Icc scaling factor that falls within the target range is selected, IccMax and Icc standby specifications can also be finalized at step 715.

Figure 8:
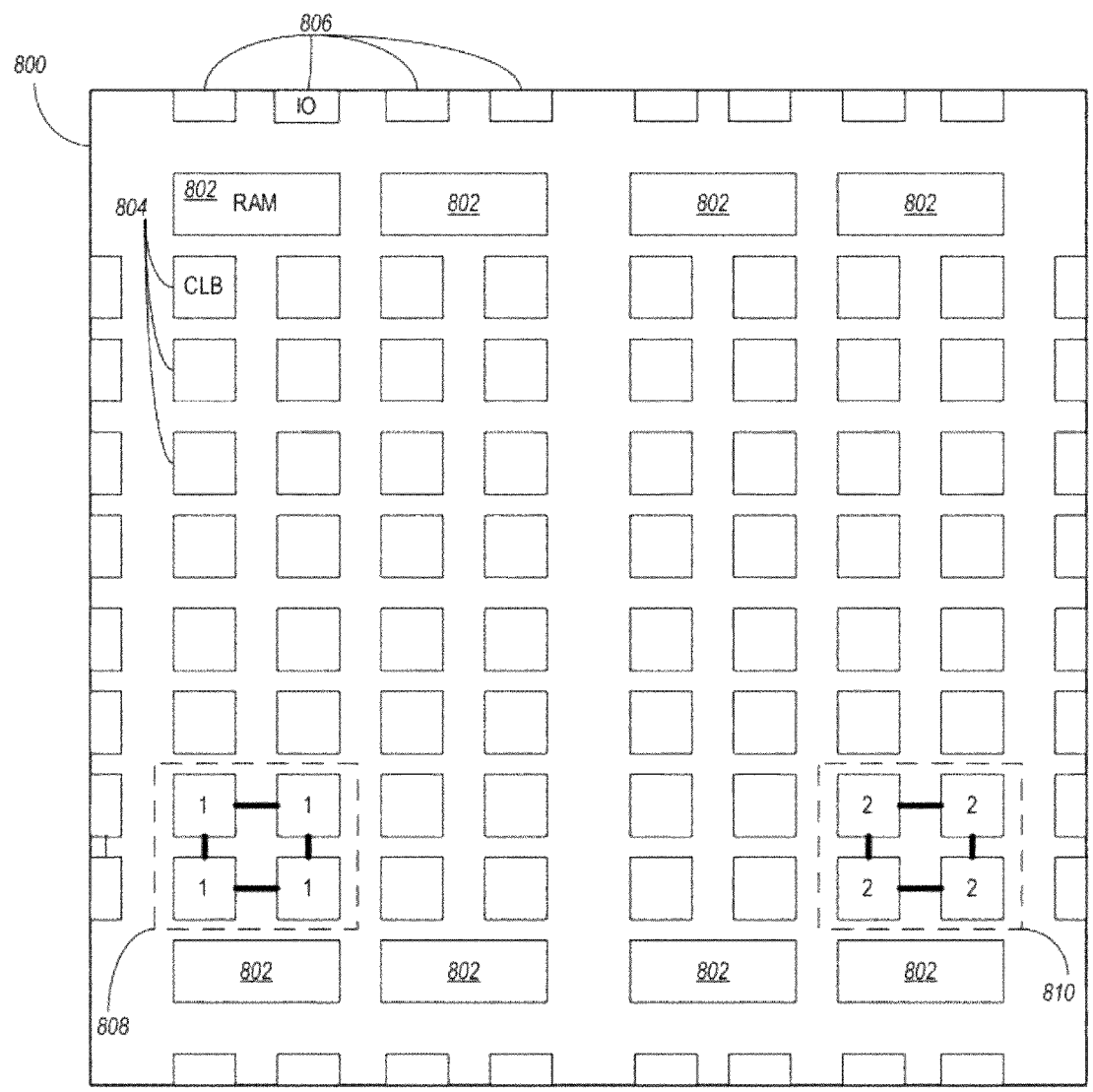
FIG. 8 illustrates a typical field programmable gate array configured with two oscillators in accordance with an embodiment of the invention.

In one or more embodiments of the invention, the speed and performance characteristic of the integrated circuit is determined by configuring a field programmable gate array (FPGA) to include one or more identical ring oscillators as discussed above. FIG. 8 shows a typical field programmable gate array (FPGA) 800 configured with two oscillators in accordance with an embodiment of the invention. An FPGA generally includes memory units (RAM) 802 for storage, configurable logic blocks (CLBs) 804, and input/output blocks (IO) 806 to communicate with other devices. Oscillators 808 and 810 combine four logic blocks in a ring to create ring oscillators. Each CLB constitutes one buffer in the ring oscillator described above. These oscillators will create independent clock cycles whose frequency will depend on the propagation delay of the transistors making up the CLBs. Depending on the FPGA, the CLBS may implement a counter within one of the CLBs. Alternatively, an additional CLB may be associated with the CLBs of the oscillator and configured to operate as the counter.

Figure 9:
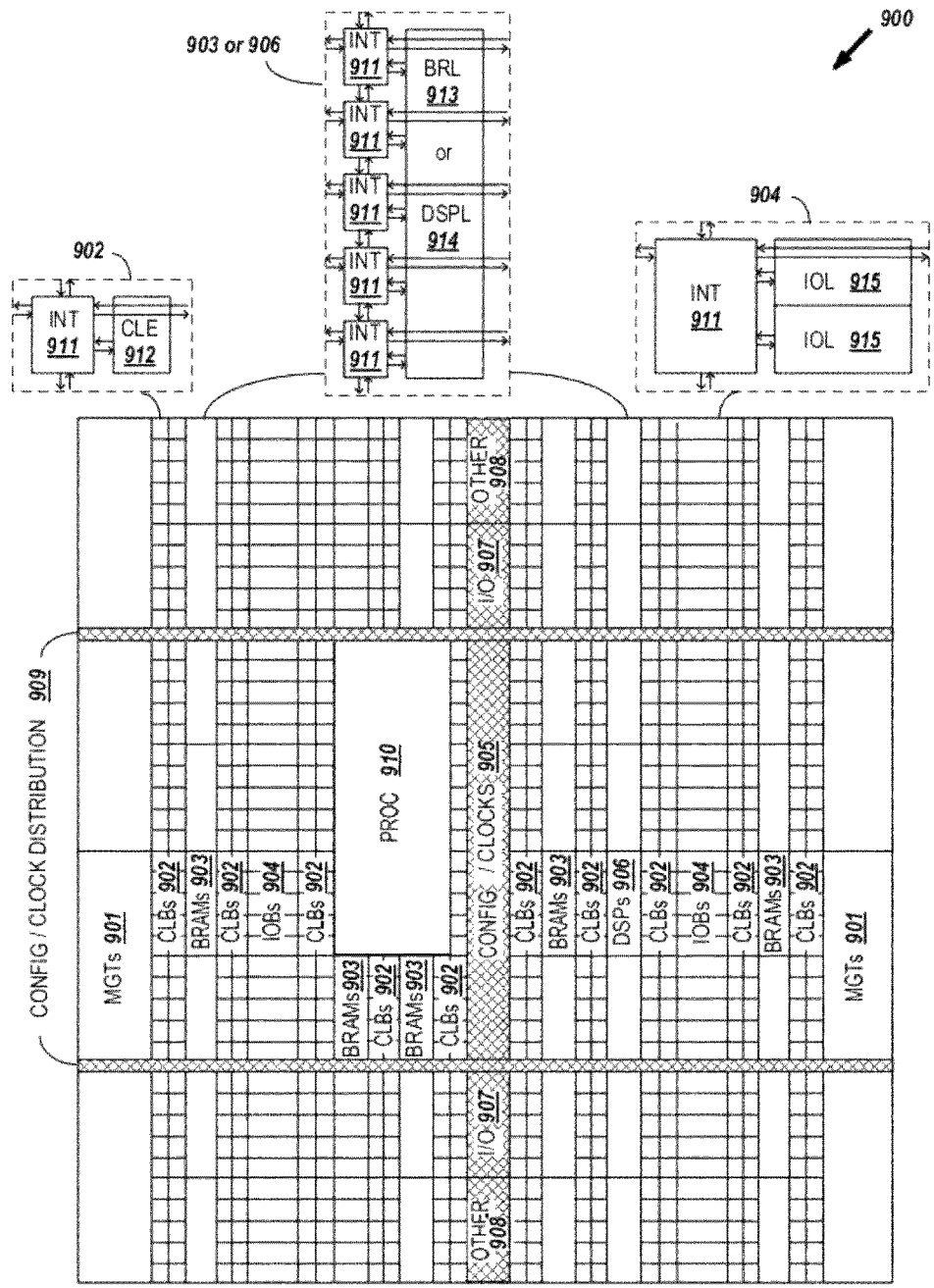
FIG. 9 illustrates a block diagram of an example programmable logic device that may be used in implementing a system for estimating the ITSF factor of an integrated circuit in accordance with an embodiment of the invention.

FIG. 9 is a block diagram of an example programmable logic integrated circuit that may be used in implementing a system for estimating the ICTS factor of an integrated circuit in accordance with an embodiment of the invention. The processes, as previously described, may be implemented on the programmable logic integrated circuit and interconnect resources of the programmable logic integrated circuit.

FPGAs can include several different types of programmable logic blocks in the array. For example, FPGA architecture 900 includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907, for example, e.g., clock ports, and other programmable logic 908 such as digital clock managers, analog-to-digital converters, system monitoring logic, and so forth. Some FPGAs also include dedicated processor blocks (PROC) 910.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic plus a single programmable interconnect element NT 911. A BRAM 903 can include a BRAM logic element (BRL) 913 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 906 can include a DSP logic element (DSPL) 914 in addition to an appropriate number of programmable interconnect elements. An IOB 904 can include, for example, two instances of an input/output logic element (IOL) 915 in addition to one instance of the programmable interconnect element INT 911. As will be clear to those of skill in the art, the actual I/O pads connected, for example, to the I/O logic element 915 are manufactured using metal layered above the various illustrated logic blocks, and typically are not confined to the area of the input/output logic element 915.

In the pictured embodiment, a columnar area near the center of the die (shown shaded in FIG. 9) is used for configuration, clock, and other control logic. Horizontal areas 909 extending from this column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear, to facilitate the efficient implementation of user logic.

Those skilled in the art will appreciate that various alternative computing arrangements, including one or more processors and a memory arrangement configured with program code, would be suitable for hosting the processes and data structures of one or more embodiments of the present invention.

Figure 10:
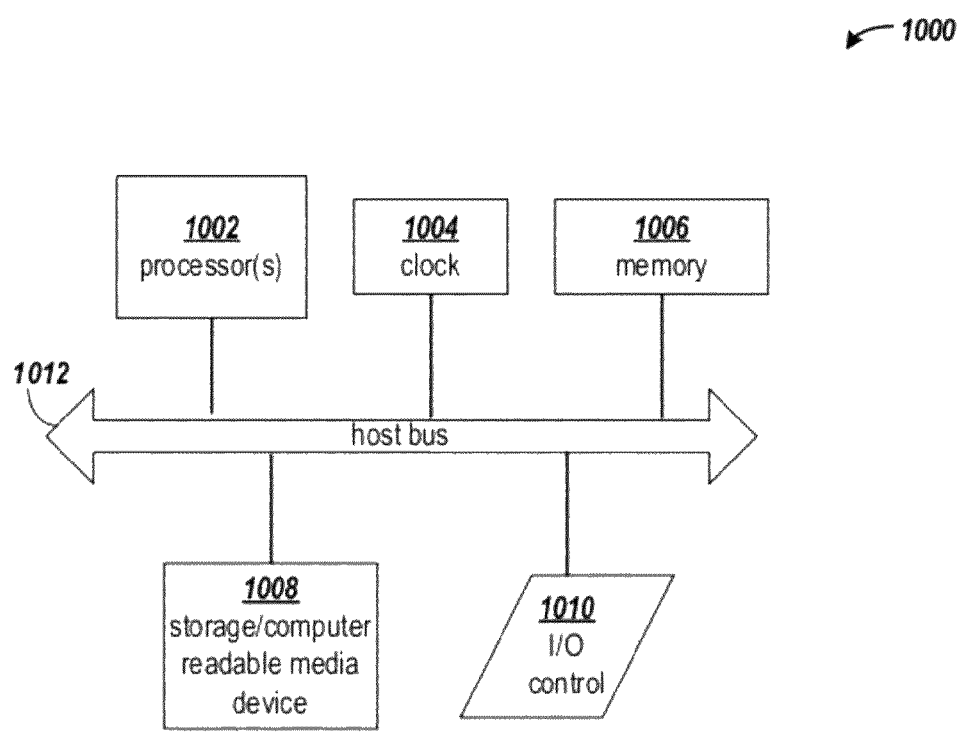
FIG. 10 illustrates a block diagram of an example computing arrangement on which the processes described herein may be implemented.

FIG. 10 is a block diagram of an example computing arrangement on which the processes described herein may be implemented. Those skilled in the art will appreciate that various alternative computing arrangements, including one or more processors and a memory arrangement configured with program code, would be suitable for hosting the processes and data structures and implementing the algorithms of one or more embodiments of the present invention. The computer code, comprising the processes of the present invention encoded in a processor executable format, may be stored and provided via a variety of computer-readable storage media or delivery channels such as magnetic or optical disks or tapes, electronic storage devices, or as application services over a network.

Processor computing arrangement 1000 includes one or more processors 1002, a clock signal generator 1004, a memory unit 1006, a storage unit 1008, and an input/output control unit 1010 coupled to host bus 1012. The arrangement 1000 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 1002 may be one or more general purpose processors, or a combination of one or more general purpose processors and suitable co-processors, or one or more specialized processors (e.g., RISC, CISC, pipelined, etc.).

The memory arrangement 1006 typically includes multiple levels of cache memory, a main memory. The storage arrangement 1008 may include local and/or remote persistent storage such as provided by magnetic disks (not shown), flash, EPROM, or other non-volatile data storage. The storage unit may be read or read/write capable. Further, the memory 1006 and storage 1008 may be combined in a single arrangement.

The processor arrangement 1002 executes the software in storage 1008 and/or memory 1006 arrangements, reads data from and stores data to the storage 1008 and/or memory 1006 arrangements, and communicates with external devices through the input/output control arrangement 1010. These functions are synchronized by the clock signal generator 1004. The resource of the computing arrangement may be managed by either an operating system (not shown), or a hardware control unit (not shown).

The present invention is thought to be applicable to a variety of systems for estimating the ICTS factor of an integrated circuit. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

The invention claimed is:

1. A method for estimating an Icc current temperature scaling factor of an integrated circuit, comprising:
   determining a level of propagation delay of a portion of the integrated circuit; and
   on a processor, determining an estimated Icc current temperature scaling factor from a correlation between the level of the propagation delay and a modeled Icc current temperature scaling factor.

2. The method of claim 1, wherein the determining an estimated Icc current temperature scaling factor comprises:
   determining a transistor length/width distribution of transistors used in the integrated circuit;
   determining a transistor on-current, a transistor off-current and a transistor gate-leakage current of transistors used in the integrated circuit at both a room temperature and a high temperature; and
   determining the estimated Icc current temperature scaling factor from a correlation between the transistor length/width distribution, the transistor-on current level, the transistor-off current level, the transistor gate leakage current level, and the level of propagation delay to the modeled Icc current temperature scaling factor.

3. The method of claim 2, wherein the transistor on-current and the transistor off-current are determined by retrieving transistor on current and transistor off current of transistors from a current look-up table based on a length and a width of the transistor.

4. The method of claim 3, wherein:
   the determining a level of propagation delay includes:
      configuring the integrated circuit to include at least one ring oscillator that oscillates at a frequency that depends on a propagation delay of the at least one ring oscillator; and
      determining the frequency at which the at least one ring oscillator oscillates; and the level of propagation delay is determined as a function of a correlation of the frequency of the generated clock signal to the level of propagation delay.

5. The method of claim 3, wherein the determining a level of propagation delay includes:
configuring an integrated circuit simulation to include at least one ring oscillator that oscillates at a frequency that depends on a propagation delay of the at least one ring oscillator;
simulating the circuit and determining the frequency at which the at least one ring oscillator oscillates; and
determining the level of propagation delay from a correlation of the frequency of the generated clock signal to the level of propagation delay.

6. The method of claim 4, wherein the integrated circuit is a programmable logic device.

7. The method of claim 5, wherein the at least one ring oscillator is designed to simulate a propagation delay of an logic core implemented on the integrated circuit.

8. The method of claim 2, wherein the transistor length/width distribution used in the integrated circuit is determined with length/width extraction tools.

9. A method of setting device targets of a circuit design comprising:
configuring a circuit design to include one or more ring oscillators that oscillate at a frequency that depends on a propagation delay of the one or more ring oscillators;
configuring simulation settings for a target device;
simulating the circuit design;
determining the propagation delay of the one or more ring oscillators;
on a processor, determining an Icc current temperature scaling factor from a correlation between the propagation delay and a modeled Icc current temperature scaling factor; and
determining whether the determined Icc current temperature scaling factor falls within a specified range.

10. The method of claim 9, further comprising:
in response to the determined Icc current temperature scaling factor falling outside of a predetermined target range, performing the following steps:
selecting a new device target; and
repeating the configuring simulation settings, the simulating, the determining the propagation delay, and the determining an Icc current temperature scaling factor, and determining whether the determined Icc current temperature scaling factor falls within a specified range using the new device target.

11. The method of claim 9, further comprising:
in response to the determined Icc current temperature scaling factor falling outside of a predetermined target range, performing an analysis to detect possible hot spots causing contention currents on the circuits of the circuit design.

12. The method of claim 9, further comprising:
in response to the determined Icc current temperature scaling factor falling outside of a predetermined target range, performing the following steps:
determining whether device characteristics are a possible cause of Icc current temperature scaling factor falling outside of the predetermined target range; and
in response to determining device characteristics are a possible cause, performing steps of:
adjusting device characteristics; and
repeating the following steps:
determining the Icc current temperature scaling factor from a correlation between the propagation delay and a product design model to the modeled Icc current temperature scaling factor; and
determining whether the determined Icc current temperature scaling factor falls within a specified range.

13. The method of claim 11, further comprising:
in response to determining device characteristics are not a possible cause, performing steps of:
selecting a new device target; and
repeating the configuring simulation settings, the simulating, the determining propagation delay, the determining an Icc current temperature scaling factor, and the determining whether the determined Icc current temperature scaling factor falls within a specified range.

14. The method of claim 9, further comprising, in response to the determined Icc current temperature scaling factor falling within a predetermined target range, determining IccMax current specifications at temperatures above a room temperature.

15. The method of claim 9, further comprising, in response to the determined Icc current temperature scaling factor falling within a predetermined target range, determining an Icc standby current specification at temperatures above a room temperature.

16. A system for estimating an Icc current temperature scaling factor of an integrated circuit, comprising:
a processor;
a common bus coupled to the processor;
a memory coupled to the common bus; and
an input/output unit coupled to the common bus,
wherein the memory is configured with instructions that when executed by the processor cause the processor to determine a level of propagation delay of a portion of the integrated circuit, and determine an estimated Icc current temperature scaling factor from a correlation between the level of propagation delay and a modeled Icc current temperature scaling factor.

17. The system of claim 16, wherein the memory is configured with further instructions for causing the processor to:
determine a length/width distribution of transistors used in the integrated circuit;
determine a transistor on-current level, a transistor off-current level and a transistor gate-leakage current level of transistors used in the integrated circuit at both a room temperature and a high temperature; and
determine the estimated Icc current temperature scaling factor from a correlation between the transistor length/width distribution, the transistor-on current level, the transistor-off current level, the transistor gate leakage current level, and the level of propagation delay to the modeled Icc current temperature scaling factor.

18. The system of claim 17, wherein the memory is configured with further instructions for causing the processor to determine the transistor on-current level and the transistor off-current level by retrieving the transistor-on current level and the transistor-off current level from a transistor look-up table based on a length and width of the transistor.

19. The system of claim 16, further comprising:
an integrated circuit coupled to the input/output unit, wherein the integrated circuit is configured to include at least one ring oscillator that oscillates at a frequency that depends on a propagation delay of the at least one ring oscillator,
wherein the memory is configured with further instructions for causing the processor to determine the level of propagation delay using the frequency of a clock signal generated by the at least one ring oscillator.

20. The system of claim 16, wherein the memory is configured with further instructions for causing the processor to:
configure an integrated circuit design to include at least one ring oscillator that oscillates at a frequency that depends on a propagation delay of the at least one ring oscillator;
simulate the integrated circuit design and determine a frequency of a clock signal generated by the at least one ring oscillator; and
determine the level of propagation delay from a correlation of the frequency of the generated clock signal to the level of propagation delay.

* * * * *